United States Patent
Mayer et al.

(10) Patent No.: US 7,843,753 B2
(45) Date of Patent: Nov. 30, 2010

(54) INTEGRATED CIRCUIT INCLUDING MEMORY REFRESHED BASED ON TEMPERATURE

(75) Inventors: Peter Mayer, Apex, NC (US); Nicholas Heath, Apex, NC (US); Rom-Shen Kao, Durham, NC (US); Jason Parrish, Durham, NC (US)

(73) Assignee: Qimonda AG, Munich (DE)

( * ) Notice: Subject to any disclaimer, the term of this patent is extended or adjusted under 35 U.S.C. 154(b) by 231 days.

(21) Appl. No.: 12/051,387

(22) Filed: Mar. 19, 2008

(65) Prior Publication Data
US 2009/0238020 A1 Sep. 24, 2009

(51) Int. Cl.
*G11C 7/00* (2006.01)
(52) U.S. Cl. ............... 365/222; 365/211; 365/225.7
(58) Field of Classification Search ............. 365/222, 365/211, 225.7
See application file for complete search history.

(56) References Cited

U.S. PATENT DOCUMENTS

| | | | |
|---|---|---|---|
| 5,278,796 A | 1/1994 | Tillinghast et al. | |
| 5,784,328 A | 7/1998 | Irrinki et al. | |
| 6,404,690 B2 | 6/2002 | Johnson et al. | |
| 6,898,140 B2 | 5/2005 | Leung et al. | |
| 7,027,343 B2 | 4/2006 | Sinha et al. | |
| 7,035,157 B2 | 4/2006 | Chang | |
| 7,177,218 B2* | 2/2007 | Choi et al. | 365/211 |
| 7,180,806 B2* | 2/2007 | Ikeda et al. | 365/222 |
| 7,206,244 B2 | 4/2007 | Cruz et al. | |
| 7,233,538 B1 | 6/2007 | Wu et al. | |
| 7,295,484 B2 | 11/2007 | Cruz et al. | |
| 2005/0036380 A1 | 2/2005 | Su | |
| 2007/0121408 A1* | 5/2007 | Yang et al. | 365/222 |

* cited by examiner

*Primary Examiner*—Anh Phung
*Assistant Examiner*—Toan Le
(74) *Attorney, Agent, or Firm*—Coats & Bennett, P.L.L.C.

(57) ABSTRACT

An integrated circuit includes an array of memory cells and a first circuit. The array includes word lines. Each word line is coupled to a plurality of memory cells. The first circuit is configured to refresh memory cells along a first number of word lines in response to a refresh command. The first number of word lines is based on a sensed temperature.

20 Claims, 2 Drawing Sheets

INTEGRATED CIRCUIT INCLUDING MEMORY REFRESHED BASED ON TEMPERATURE

BACKGROUND

One type of memory is a dynamic random access memory (DRAM). A DRAM includes memory cells arranged in rows and columns in an array, with the rows extending along an x-direction and the columns extending along a y-direction. Conductive word lines extend across the array of memory cells along the x-direction and conductive bit lines extend across the array of memory cells along the y-direction. A memory cell is located at each cross point of a word line and a bit line. Memory cells are accessed using a row address and a column address.

DRAM memory cells include a capacitor and an access device, such as a transistor, for accessing the capacitor. Data is stored in the capacitors of DRAM memory cells in the form of electric charges. Data retention time is therefore limited, since over time the stored charge on each capacitor gradually leaks off. To prevent data corruption, the charge on each capacitor is periodically refreshed. The time within which a refresh is performed to prevent such data corruption is commonly referred to as the refresh interval. To refresh data in a memory array, the array is typically placed in a sense mode that senses the data stored in a row of memory cells and writes the data back to the memory cells, thus maintaining the stored data.

DRAM memory cells are typically refreshed in response to auto refresh commands issued by a memory controller in a host. Each auto refresh command refreshes memory cells along a specified number of word lines. The memory controller issues the refresh commands such that the memory cells along all the word lines within the memory array are refreshed within a specified period, such as 32 ms. Extending the refresh interval (i.e., reducing the refresh frequency) consumes less power, which is desirable to reduce power consumption. If the refresh interval is extended beyond the data retention time, however, errors can occur resulting in reduced data quality. Shortening the refresh interval (i.e., increasing the refresh frequency) improves the data quality, but can result in excess power consumption.

The data retention time of a DRAM decreases as the temperature of the DRAM increases. Typical DRAMs, which have a fixed refresh interval, can only be operated at temperatures up to 100° C. without increasing the refresh frequency (i.e., increasing the frequency of the auto refresh commands) to avoid data loss. Future applications for DRAM, such as graphic cards, however, may develop temperatures greater than 100° C., such as 120° C.

For these and other reasons, there is a need for the present invention.

SUMMARY

One embodiment provides an integrated circuit. The integrated circuit includes an array of memory cells and a first circuit. The array includes word lines. Each word line is coupled to a plurality of memory cells. The first circuit is configured to refresh memory cells along a first number of word lines in response to a refresh command. The first number of word lines is based on a sensed temperature.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
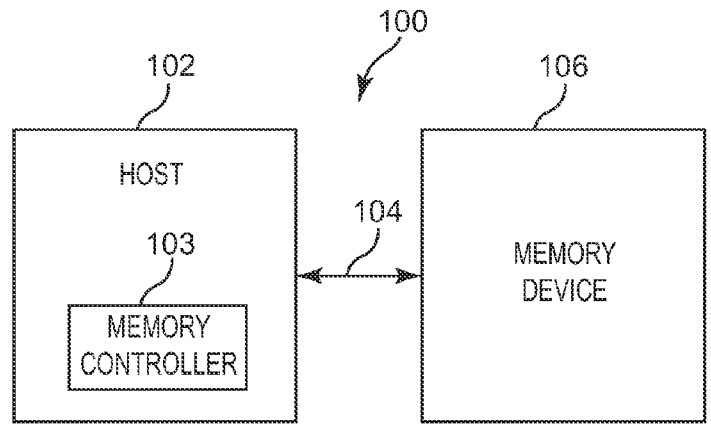
FIG. 1 is a block diagram illustrating one embodiment of a system.

FIG. 1 is a block diagram illustrating one embodiment of a system 100. System 100 includes a host 102 and a memory device 106. Host 102 is communicatively coupled to memory device 106 through communication link 104. Host 102 includes a microprocessor, computer (e.g., desktop, laptop, handheld), portable electronic device (e.g., cellular phone, personal digital assistant (PDA), MP3 Player, video player, digital camera), or any other suitable device that uses memory.

Host 102 includes a memory controller 103. Memory controller 103 controls the operation of memory device 106. Memory controller 103 includes a microprocessor, microcontroller, or other suitable logic circuitry for controlling the operation of memory device 106. Memory device 106 provides memory for host 102. In one embodiment, memory device 106 includes a dynamic random access memory (DRAM) device or another suitable volatile memory device.

Memory cells within memory device 106 are refreshed based on temperature. Memory controller 103 issues auto refresh commands at a constant rate independent of temperature, such that a bandwidth of memory device 106 does not vary with temperature. In response to each auto refresh command, the memory cells along a variable number of word lines are refreshed. The number of word lines refreshed is based on the temperature of memory device 106. As the temperature of memory device 106 increases, the number of word lines refreshed in response to each auto refresh command increases. As the temperature of memory device 106 decreases, the number of word lines refreshed in response to each auto refresh command decreases.

As used herein, the term "electrically coupled" is not meant to mean that the elements must be directly coupled together and intervening elements may be provided between the "electrically coupled" elements.

Figure 2:
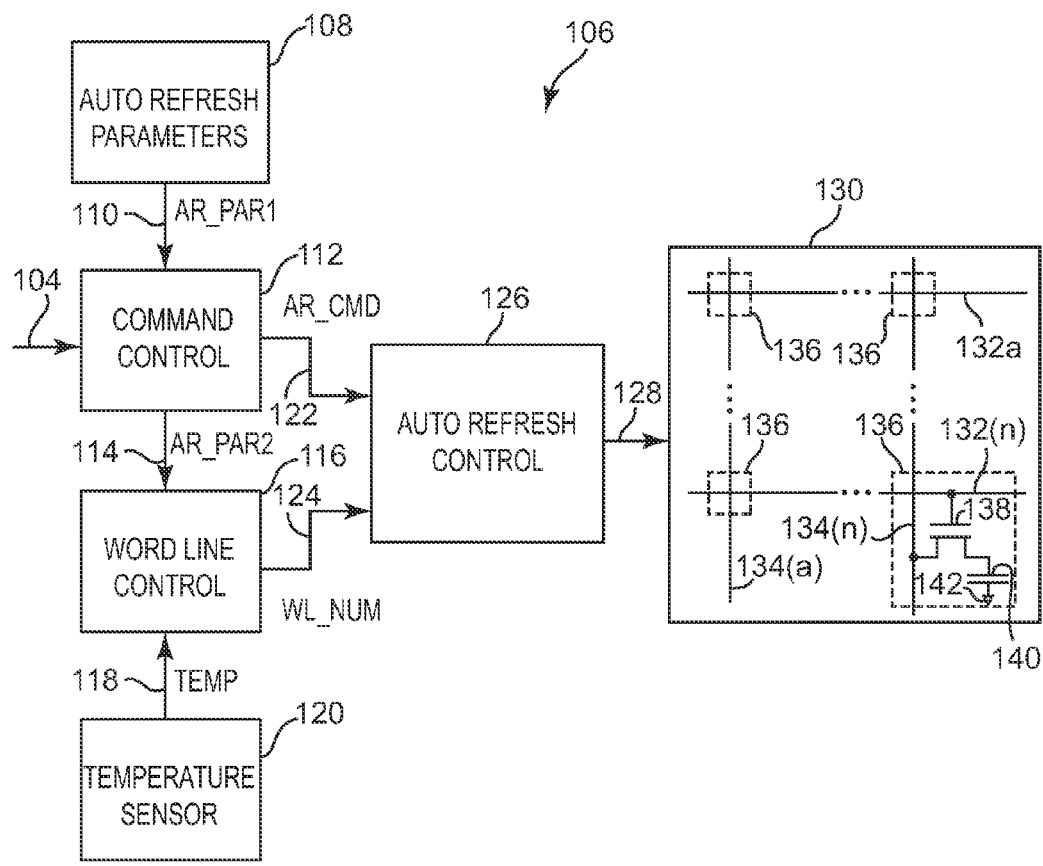
FIG. 2 is a block diagram illustrating one embodiment of a memory device.

FIG. 2 is a block diagram illustrating one embodiment of memory device 106. Memory device 106 includes an auto refresh parameters storage device 108, a command control circuit 112, a word line control circuit 116, a temperature sensor 120, an auto refresh control circuit 126, and a memory array 130. The output of auto refresh parameters storage device 108 is electrically coupled to a first input of command control circuit 112 through auto refresh parameters (AR_PAR1) signal path 110. A second input of command control circuit 112 is electrically coupled to memory controller 103 of host 102 through communication link 104. A first output of command control circuit 112 is electrically coupled to a first input of auto refresh control circuit 126 through auto refresh command (AR_CMD) signal path 122. A second output of command control circuit 112 is electrically coupled to a first input of word line control circuit 116 through auto refresh parameter (AR_PAR2) signal path 114. A second input of word line control circuit 116 is electrically coupled to an output of temperature sensor 120 through temperature (TEMP) signal path 118. The output of word line control circuit 116 is electrically coupled to a second input of auto refresh control circuit 126 through word line number (WL_NUM) signal path 124. The output of auto refresh control circuit 126 is electrically coupled to an input of memory array 130 through signal path 128.

Auto refresh parameters storage device 108 include fuses (e.g., electrical fuses, laser fuses), registers (e.g., mode registers), a non-volatile memory (e.g., FLASH, EPROM), or another suitable device for storing auto refresh parameters. The auto refresh parameters include information for adjusting the number of word lines refreshed in response to each auto refresh command based on temperature. In one embodiment, the auto refresh parameters include a table indicating the number of word lines to be refreshed for each temperature range. In another embodiment, the auto refresh parameters include the definition of an equation used to calculate the number of word lines to be refreshed based on the temperature. In other embodiments, the auto refresh parameters include other suitable information for determining the number of word lines to be refreshed in response to each auto refresh command based on the temperature. Auto refresh parameters storage device 108 passes the auto refresh parameters to command control circuit 112 through AR_PAR1 signal path 110.

Command control circuit 112 receives the auto refresh parameters from auto refresh parameters storage device 108 through AR_PAR1 signal path 110. In one embodiment, command control circuit 112 interprets or decodes the auto refresh parameters. Command control circuit 112 passes the auto refresh parameters to word line control circuit 116 through AR_PAR2 signal path 114.

In addition, command control circuit 112 receives auto refresh commands from memory controller 103 of host 102 through communication link 104. Command control circuit 112 passes the auto refresh commands to auto refresh control circuit 126 through AR_CMD signal path 122. Memory controller 103 of host 102 issues the auto refresh commands to command control circuit 112 at a constant rate independent of temperature.

Temperature sensor 120 senses the temperature of memory device 106. Temperature sensor 120 passes a temperature signal indicating the sensed temperature of memory device 106 to word line control circuit 116 through TEMP signal path 118.

Word line control circuit 116 receives the auto refresh parameters from command control circuit 112 through AR_PAR2 signal path 114 and the temperature sensor signal from temperature sensor 120 through TEMP signal path 118. Word line control circuit 116 determines the number of word lines to be refreshed within memory array 130 for each auto refresh command based on the sensed temperature and the auto refresh parameters. In response to a higher temperature, word line control circuit 126 increases the number of word lines to be refreshed for each auto refresh command. In response to a lower temperature, word line control circuit 126 decreases the number of word lines to be refreshed for each auto refresh command.

For example, in one embodiment, for a temperature less than 100° C., word line control circuit 116 sets the number of word lines to be refreshed to 1x, where "x" is a specified number of word lines for refreshing all the memory cells in memory array 130 within a data retention time based on the rate of auto refresh commands. In response to a temperature greater than 100° C., word line control circuit 116 sets the number of word lines to be refreshed to 2x. In other embodiments, word line control circuit 116 sets another suitable number of word lines to be refreshed based on the temperature and the auto refresh parameters. For example, based on what temperature range the sensed temperature falls within, control circuit 116 may set the number of word lines to be refreshed to 1x, 2x, 3x, 4x, etc., or fractional portions thereof. Word line control circuit 116 passes the number of word lines to be refreshed in response to each auto refresh command to auto refresh control circuit 126 through WL_NUM signal path 124.

Auto refresh control circuit 126 receives auto refresh commands from command control circuit 112 through AR_CMD signal path 122 and the number of word lines to be refreshed in response to each auto refresh command from word line control circuit 116 through WL_NUM signal path 124. In response to each auto refresh command, auto refresh control circuit 126 provides signals on signal path 128 to memory array 130 to refresh the memory cells along the specified number of word lines in memory array 130.

Memory array 130 receives signals from auto refresh control circuit 126 through signal path 128 for refreshing memory cells within the memory array. Memory array 130 includes a plurality of word lines 132a-132(n) (collectively referred to as word lines 132) and a plurality of bit lines 134a-134(n) (collectively referred to as bit lines 134). A memory cell 136 is located at each cross point of each word line 132 and each bit line 134.

In one embodiment, each memory cell 136 includes a transistor 138 and a capacitor 140. The gate of each transistor 138 is electrically coupled to a word line 132. One side of the source-drain path of each transistor 138 is electrically coupled to a bit line 134 and the other side of the source-drain path of each transistor 138 is electrically coupled to one side of a capacitor 140. The other side of each capacitor 140 is electrically coupled to a common or ground 142. Capacitor 140 is charged or discharged to represent either a logic "0" or a logic "1". In other embodiments, other suitable memory cell elements and structures are used.

In response to signals through signal path 128, memory cells 136 along the specified number of word lines are refreshed in response to each auto refresh command. Memory cells 136 are refreshed within the data retention time for the sensed temperature. While the number of memory cells 136 refreshed in response to each auto refresh command varies with temperature, the bandwidth of memory controller 103 of host 102 for processing read and write commands is not affected by temperature changes. In addition, by reducing the number of memory cells 136 refreshed in response to each auto refresh command at lower temperatures, power consumption is reduced.

In operation, temperature sensor 120 continuously senses the temperature of memory device 106. Command control circuit 112 interprets and passes the auto refresh parameters from auto refresh parameters storage device 108 to word line control circuit 116. Word line control circuit 116 sets the number of word lines to be refreshed in response to each auto refresh command based on the sensed temperature and the auto refresh parameters. Memory controller 103 of host 102 issues the auto refresh commands to command control circuit 112 at a constant rate independent of the sensed temperature. Command control circuit 112 passes the auto refresh commands to auto refresh control circuit 126. In response to each auto refresh command from command control circuit 112, auto refresh control circuit 126 refreshes the memory cells along the specified number of word lines in memory array 130. In this way, the bandwidth of memory device 106 is not reduced in response to an increase in temperature, yet memory cells 136 of memory array 130 are refreshed in a shorter time in response to an increase in temperature.

Figure 3:
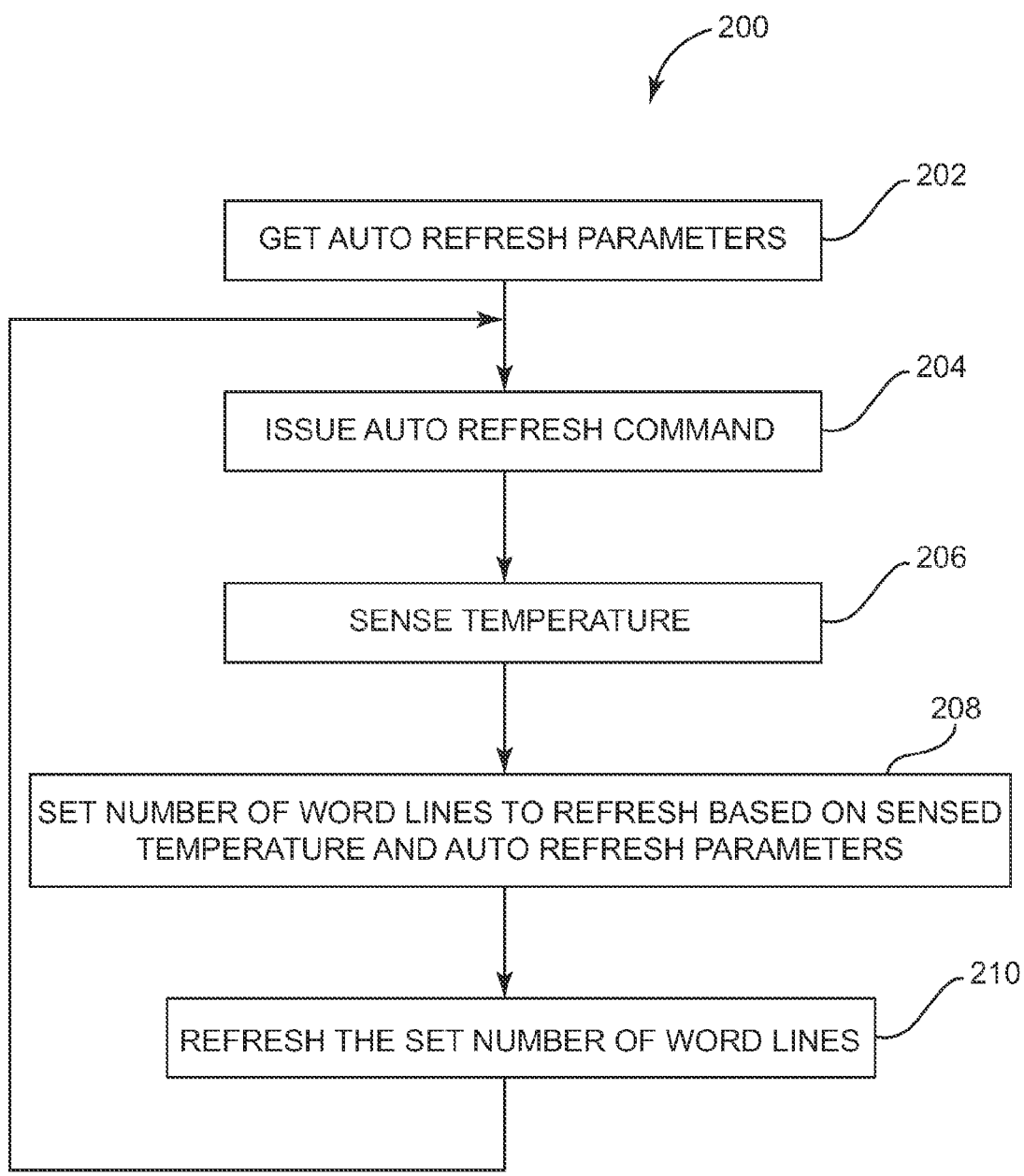
FIG. 3 is a flow diagram illustrating one embodiment of a method for refreshing memory cells.

FIG. 3 is a flow diagram illustrating one embodiment of a method 200 for refreshing memory cells, such as memory cells 136 of memory array 130 previously described and illustrated with reference to FIG. 2. At 202, the auto refresh parameters for determining the number of word lines to be refreshed in response to each auto refresh command are retrieved. At 204, an auto refresh command is issued. At 206, the temperature of the memory is sensed. At 208, the number of word lines to be refreshed is set based on the sensed temperature and the auto refresh parameters. At 210, the memory cells along the set number of word lines in the memory array are refreshed. Control then returns to 204 where the next auto refresh command is issued based on a constant auto refresh command frequency. The process then repeats such that all memory cells within the memory array are refreshed within the data retention time for the memory array at the sensed temperature.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   an array of memory cells, the array including word lines, each word line coupled to a plurality of memory cells; and
   a first circuit configured to refresh memory cells along a first number of word lines in response to a refresh command, the first number of word lines based on a sensed temperature.

2. The integrated circuit of claim 1, further comprising:
   a second circuit configured to receive refresh commands at a constant rate independent of the sensed temperature.

3. The integrated circuit of claim 2, wherein the first circuit is configured to refresh memory cells along the first number of word lines in response to each refresh command and a first sensed temperature, and to refresh memory cells along a second number of word lines in response to each refresh command and a second sensed temperature.

4. The integrated circuit of claim 3, wherein the first temperature is less than the second temperature, and
   wherein the first number of word lines is less than the second number of word lines.

5. The integrated circuit of claim 1, further comprising:
   a temperature sensor configured to sense a temperature of the integrated circuit to provide the sensed temperature.

6. The integrated circuit of claim 1, wherein the array comprises an array of dynamic random access memory cells.

7. The integrated circuit of claim 1, further comprising:
   a storage device configured to store refresh parameters,
   wherein the first number of word lines is based on the sensed temperature and the refresh parameters.

8. The integrated circuit of claim 7, wherein the storage device comprises one of fuses and a non-volatile memory.

9. A system comprising:
   a host including a memory controller, the memory controller configured to provide refresh commands at a constant rate; and
   a memory device communicatively coupled to the host, the memory device comprising:
      an array of memory cells, the array including word lines, each word line coupled to a plurality of memory cells;
      a temperature sensor configured to sense a temperature of the memory device; and
      a circuit configured to refresh memory cells along a first number of word lines in response to a first refresh command, the first number of word lines based on the sensed temperature.

10. The system of claim 9, wherein the first number of word lines is based on a first sensed temperature, and
    wherein the circuit is configured to refresh memory cells along a second number of word lines in response to a second refresh command, the second number of word lines based on a second sensed temperature.

11. The system of claim 10, wherein the first temperature is less than the second temperature, and
    wherein the first number of word lines is less than the second number of word lines.

12. The system of claim 9, wherein the array comprises an array of dynamic random access memory cells.

13. The system of claim 9, wherein the memory device further comprises:
    a storage device configured to store refresh parameters,
    wherein the first number of word lines is based on the sensed temperature and the refresh parameters.

14. The system of claim 13, wherein the storage device comprises one of fuses and a non-volatile memory.

15. A method for operating a memory, the method comprising:
    providing an array of memory cells, the array including word lines, each word line coupled to a plurality of memory cells;
    issuing a first refresh command;
    sensing a first temperature;
    determining a first number of word lines to refresh based on the sensed first temperature; and
    refreshing memory cells along the first number of word lines in response to the first refresh command.

16. The method of claim 15, further comprising:
    issuing refresh commands at a constant rate independent of a sensed temperature.

17. The method of claim 15, further comprising:

issuing a second refresh command;

sensing a second temperature different from the first temperature;

determining a second number of word lines different from the first number to refresh based on the sensed second temperature; and refreshing memory cells along the second number of word lines in response to the second refresh command.

18. The method of claim 17, wherein sensing the second temperature comprises sensing a second temperature greater than the first temperature, and wherein determining the second number of word lines comprises determining a second number of word lines greater than the first number.

19. The method of claim 15, further comprising:

retrieving refresh parameters, wherein determining the first number of word lines to refresh comprises determining the first number of word lines to refresh based on the sensed first temperature and the refresh parameters.

20. The method of claim 15, wherein providing the array comprises providing an array of dynamic random access memory cells.

* * * * *